United States Patent
Kang et al.

(10) Patent No.: US 7,299,236 B2
(45) Date of Patent: Nov. 20, 2007

(54) TEST DATA COMPRESSION AND DECOMPRESSION METHOD USING ZERO-DETECTED RUN-LENGTH CODE IN SYSTEM-ON-CHIP

(75) Inventors: Sung-Ho Kang, Seoul (KR); Yong Lee, Seoul (KR)

(73) Assignee: Industry-Academic Cooperation Foundation, Yonsei University, Seodaemoon-Gu, Seoul (KR)

( * ) Notice: Subject to any disclaimer, the term of this patent is extended or adjusted under 35 U.S.C. 154(b) by 542 days.

(21) Appl. No.: 10/867,588

(22) Filed: Jun. 15, 2004

(65) Prior Publication Data

US 2005/0278400 A1 Dec. 15, 2005

(51) Int. Cl.
*G06F 17/30* (2006.01)
*G06F 7/00* (2006.01)
(52) U.S. Cl. .......................... 707/101; 707/102; 707/6
(58) Field of Classification Search ................ 707/101, 707/102, 6
See application file for complete search history.

(56) References Cited

U.S. PATENT DOCUMENTS

2004/0190331 A1* 9/2004 Ross et al. ................. 365/154

OTHER PUBLICATIONS

Gonciari et al.: "Improving Compression Ratio, Area Overhead, and Test Application Time for System-on-a-Chip Test Data Compression/Decompression", Proceedings of the 2002 Design, Automation and Test in Europe Conference and Exhibition.*
Li et al.: "Testing Data Compression Using Dictionaries with Selective Entries and Fixed-Length Indices", ACM Transactions on Design Automation of Electronic Systems, vol. 8, No. 4, Oct. 2003.*
Shi et al.: "FCSCAN: An Efficient Multiscan-based Test Compression Technique fro Test Cost Reduction", Department of Computer Science, Waseda University, Japan, 2006.*
Kay et al.: "Embedded Test Control Schemes for Compression in SOCs", DAC 2002, Jun. 10-14, New Orleans, Louisiana, USA.*

* cited by examiner

*Primary Examiner*—Kuen S. Lu
(74) *Attorney, Agent, or Firm*—GWIPS

(57) ABSTRACT

A method of effectively compressing a test vector is introduced for testing a system-on-chip (SOC) semiconductor device. Since the number of test vectors is increased in a SOC, the number of '0's is increased if adjacent test vectors are properly aligned using an ordering algorithm. '0000' is considered as a single block and a counter of '0-group' is incremented by one to encode each further instance of the string '0000'. A codeword capable of being decompressed can be generated using only a counter without using a memory block.

2 Claims, 2 Drawing Sheets

TEST DATA COMPRESSION AND DECOMPRESSION METHOD USING ZERO-DETECTED RUN-LENGTH CODE IN SYSTEM-ON-CHIP

BACKGROUND OF THE INVENTION

1. Field of the Invention

The present invention relates to a method of effectively compressing a test vector required for testing a system-on-chip (SOC) semiconductor device. The present invention is the result of efforts to foster and support university IT research centers, carried out by the Ministry of Information and Communication in Republic of Korea.

2. Related Prior Art

With the development of semiconductor design techniques, a system-on-chip (SOC) configuration, in which functional blocks are integrated into a single chip, can be manufactured. In order to test semiconductor devices in such a high-performance SOC, the number and complexity of test vectors to be input are increased and automatic test equipment (ATE) requires a high operating frequency and a large memory capacity. This increases time and cost required for testing the semiconductor devices. Accordingly, people have a growing interest in the compression of test vectors. The compression of the test vector enables effective utilization of a restricted channel of the ATE.

The test vector used when a semiconductor device is tested has a large number of similar bits. Thus, the test vector can represent only values that are different from each other when the exclusive-OR operation (XOR) is carried out on the bits of the test vector. This is because the elusive-OR operation outputs '0' when the input bits are identical to each other but outputs '1' when the input bits are different from each other. The original test vector $T_d$ and a test set $T_{diff}$ are defined as follows:

$T_d = \{t_1, t_2, t_3, t_4, t_5, \ldots, t_n\}$ $T_{diff} = \{d_1, d_2, d_3, \ldots, d_n\} = \{t_1, t_1 \oplus t_2, t_2 \oplus t_3, \ldots, t_{n-1} \oplus t_n\}$ According to this method, only the bits of the test vector that have different values from the corresponding bits of the previous element are represented by '1'. Thus, most of values of $T_{diff}$ are continuous '0's considering that the test vector is characterized by having a large number of identical bits.

The vector $T_{diff}$ generated as above is connected in a single chain as follows:

$T_{diff}$: $d_1$=00000100

$d_2$=00110000

$d_3$=00010001

=>000001000011000000010001

The point where the bit '1' first appears in the chain is checked and the number of digits of '0' appearing before the bit '1' is counted to generate a codeword through a method represented by Table 1.

TABLE 1

| Codeword | $T_{diff}$ |
|---|---|
| 000 | 1 |
| 001 | 01 |
| 010 | 001 |
| 011 | 0001 |
| 100 | 00001 |
| 101 | 000001 |
| 110 | 0000001 |
| 111 | 00000001 |

The generated data is stored in the ATE for use. A corresponding circuit receives the compressed codeword and decompresses the compressed codeword to use it. A decompression device used for decompressing the codeword is illustrated in FIG. 1. A cyclical scan register (CSR) can obtain the current test vector from $T_{diff}$ by applying XOR to $T_{diff}$ again. Using this process, the original test vector can be completely restored using only a single decoder.

However, as semiconductor device chips are configured as system-on-chips, the number of test vectors increases and the number of vectors having identical bits also increases. Accordingly, the conventional algorithm cannot effectively compress an increasing number of test sets for a circuit. Furthermore, a conventional statistical code compression technique increases hardware overhead and cannot make functional blocks for tests in a circuit large. There is therefore a need for a new compression technique capable of obtaining a high compression ratio using simple hardware.

SUMMARY OF THE INVENTION

Accordingly, the present invention is directed toward a test data compression and decompression method using a zero-detected run-length (ZDR) code in a system-on-chip (SOC) that substantially obviates one or more problems due to limitations and disadvantages of the related art.

An object of the present invention is to provide a method of effectively compressing test data when a device is tested in a SOC.

To accomplish the above object, according to the present invention, there is provided a test data compression method using a ZDR code in a system-on-chip (SOC), including the steps of:

defining a test vector $T_d$ to be applied and a test set $T_{diff}$ as follows;

$T_d = \{t_1, t_2, t_3, t_4, t_5, \ldots, t_n\}$ $T_{diff} = \{d_1, d_2, d_3, \ldots, d_n\} = \{t_1, t_1 \oplus t_2, t_2 \oplus t_3, \ldots, t_{n-1} \oplus t_n\}$ creating $T_d$ and $T_{diff}$ with values generated by an automatic test pattern generator (ATPG);

connecting separate elements of $T_{diff}$ in a single chain;

sequentially scanning $T_{diff}$, creating a codeword when a bit '1' appears, and when the codeword is '0000', repeatedly checking a '0 Group' while incrementing the bit of the '0 Group' counter by one until a '1' bit appears;

recording '0111' when the '0 Group' becomes '0000' ×8 and counting the number of bits having the value '0'; and creating a codeword of a '1 Group' when a '1' bit appears.

The present invention provides a compression method using a ZDR code having a variable-to-variable-length code. Specifically, in this compression method, two consecutive test vectors are compared to each other, only bits different from corresponding bits of the previous vector are represented by '1', and bits identical to corresponding bits of the previous vector are represented by '0'. This process is reversed to obtain the original test vectors.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
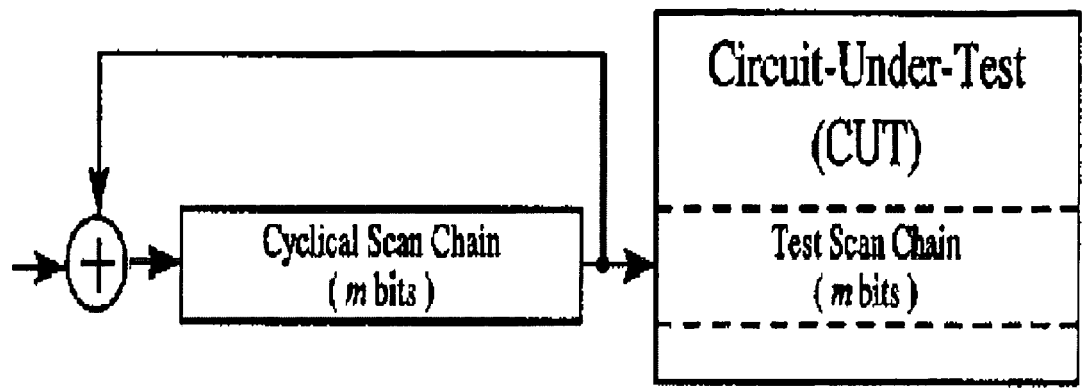
FIG. 1 illustrates a conventional decompression system.

Reference will now be made in detail to the preferred embodiments of the present invention, examples of which are illustrated in the accompanying drawings.

A test vector compression technique according to the present invention includes a compression algorithm and a decompression decoder.

[Compression Algorithm]

A ZDR code has a variable-to-variable-length code. Here, a test vector $T_d$ to be applied and a test set $T_{diff}$ are defined as follows.

$$T_d = \{t_1, t_2, t_3, t_4, t_5, \ldots, t_n\}$$

$$T_{diff} = \{d_1, d_2, d_3, \ldots, d_n\} = \{t_1, t_1 \oplus t_2, t_2 \oplus t_3, \ldots, t_{n-1} \oplus t_n\}$$

The $T_{diff}$ compares each bit of two consecutive test vectors to each other, represents bits different from the corresponding bits of the previous vector by '1' and records bits identical to corresponding bits of the previous vector as '0'. When this process is reversed, the original test vectors can be obtained. The ZDR compression method according to the present invention will now be explained in more detail with reference to Table 2.

Step 1: $T_d$ and $T_{diff}$ are generated with values created by an automatic test pattern generator (ATPG). The elements of $T_{diff}$ thus generated are connected in a single chain.

Step 2: is sequentially scanned, and when a bit '1' appears, a codeword is created. When the codeword is '0000', that is, when there are four '0's in a row, a '0 Group' is checked while increasing the bit of a '0 Group' counter by one until '1' appears as the next bit in $T_{diff}$. When the '0 Group' becomes '0000'×8, 0111 is recorded and bits having the value '0' are counted.

Step 3: When a '1' bit appears, a codeword of a '1 Group' is created. Then, the process returns to the second step to scan $T_{diff}$ bit by bit.

TABLE 2

| Group | Data | Prefix | Tail | Codeword |
|-------|------|--------|------|----------|
| 1 | 1 | 1 | 00 | 100 |
|   | 01 |   | 01 | 101 |
|   | 001 |   | 10 | 110 |
|   | 0001 |   | 11 | 111 |

TABLE 2-continued

| Group | Data | Prefix | Tail | Codeword |
|-------|------|--------|------|----------|
| 0 | 0000 | 0 | 000 | 0000 |
|   | 0000x2 |   | 001 | 0001 |
|   | 0000x3 |   | 010 | 0020 |
|   | 0000x4 |   | 011 | 0011 |
|   | 0000x5 |   | 100 | 0100 |
|   | 0000x6 |   | 101 | 0101 |
|   | 0000x7 |   | 110 | 0110 |
|   | 0000x8 |   | 111 | 0111 |

According to the above-described process, result values are not changed with the order of inputting the test vectors when a stuck-at fault is judged. Thus, a higher compression ratio can be obtained by aligning the test vectors to decrease the variation in the bits of adjacent patterns. In this case, codewords are created through the method represented in Table 4.

Since the number of test vectors is increased in a SOC configuration, the number of '0's is increased if adjacent test vectors are properly aligned using an ordering algorithm. '0000' is considered as a single block and the count of the '0-group' is increased one by one to encode each further instance of the string '0000'. A codeword capable of being decompressed can be generated using only a counter without using a memory block.

Table 3 represents a 32-bit test set to which the compression method according to the present invention is applied, and Table 4 compares the compression method using the ZDR code according to the present invention to a conventional Golomb method.

TABLE 3

| 32-bit test set ($T_{diff}$) | | |
|---|---|---|
| D1 | 0000000000000000 | 0000000100000000 |
| D2 | 0000000000001000 | 0000000000000000 |
| D3 | 0001010000000000 | 0000000000000001 |
| D4 | 0000000000000010 | 0000000000000000 |
| D5 | 0000000001000000 | 0000000000000001 |

TABLE 4

| Compression using ZDR (Present invention) |
|---|
| 0000x5 0001 0000x5 1 0000x5 001 01 0000x6 |
| 0100 111 0100 110 0100 110 101 0101 |
| 01 0000x3 001 0000x8 0001 0000x5 1 0000x5 01 |
| 001 0010 110 0111 111 0100 100 0100 101 |
| Codeword: 59 bits |

| Compression using Golomb technique |
|---|
| 0000x5 0001 0000x5 1 0000x5 001 01 0000x6 01 |
| 111110 11 111110 00 111110 10 001 1111110 01 |
| 0000x3 001 0000x8 0001 0000x5 1 0000x5 01 |
| 11110 10 111111110 11 111110 00 1111110 01 |
| Codeword: 69 bits |

[Decompression Decoder]

Figure 2:
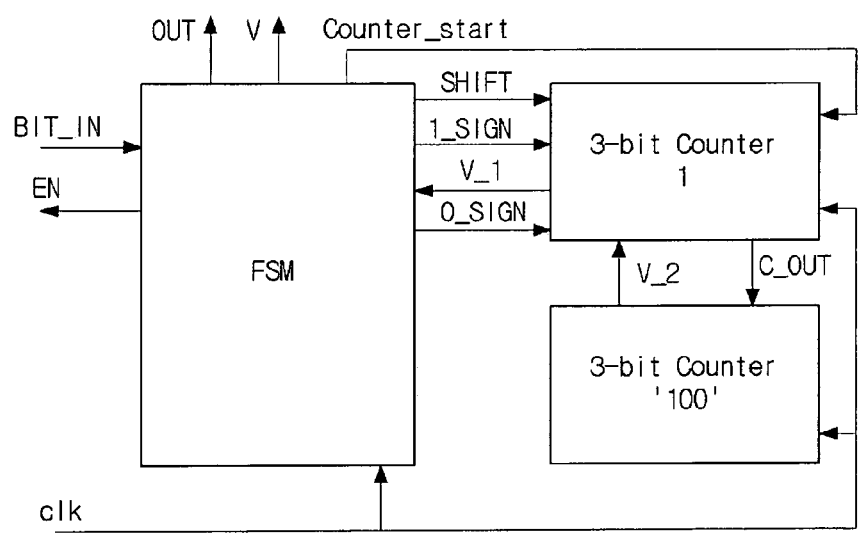
FIG. 2 illustrates the configuration of a decompression decoder according to the present invention.
Figure 3:
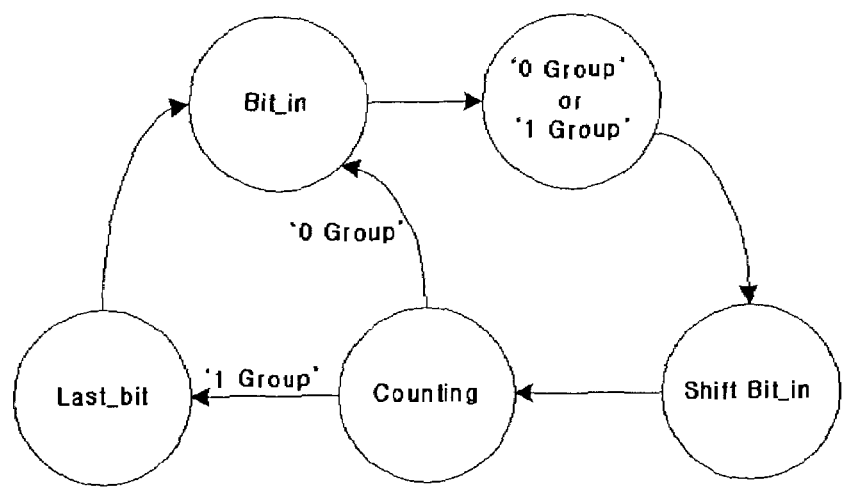
FIG. 3 illustrates the operation states of the finite state machine shown in FIG. 2.

A corresponding circuit decompresses the codeword compressed according to the present invention, in order to use it. Herein, a decompression decoder shown in FIG. 2 is used as a decompression device. FIG. 3 shows operation states of a finite state machine (FSM) of the decompression decoder shown in FIG. 2.

The operation states of the FSM have five steps, which will be described in detail.

Internal signals of the decompression decoder are explained with reference to FIG. 2.

Step 1: When a signal EN, which represents that the FSM can accept data, is output, a bit is input to the FSM through a signal BIT_IN.

Step 2: When the bit input to the FSM is '0', signals 0_SIGN and COUNTER_START of a 3-bit counter are on. When the bit input to the FSM is '1', signals 1_SIGN and COUNTER_START are on.

Step 3: 2 bits are input to the 3-bit counter through a signal SHIFT when the 0_SIGN is on and 3 bits are input to the 3-bit counter through the signal SHIFT when the 1_SIGN is on.

Step 4: The 3-bit counter is operated. While step 4 is being processed, the FSM continuously outputs '0's through a signal OUT for one clock. When the signal 0_SIGN is input to the 3-bit counter, a signal C_OUT is output from the 3-bit counter. Another 3-bit counter receives the signal C_OUT and records '100'. When the counting operation is finished, a signal V__2 is on. When the signal V__2 is input to the 3-bit counter, the 3-bit counter down-counts one bit. The operations of the counters are finished and the process returns to Step 1 when the 0_SIGN is input. When the signal 1_SIGN is input, the 3-bit counter is operated. In this case, when the count is finished, a signal V__1 is on.

Step 5: When the signal V__1 is input to the FSM, a bit '1' is output through the signal OUT and the process returns to Step 1.

The operation of the decompression decoder of the present invention includes the aforementioned five steps. As described above, the operation of the decompression decoder is very simple such that a bit '0' is output through the OUT of the FSM whenever a clock CLK is input in Step 4, a bit '1' is output through the OUT when the signal V__1 is input in Step 5, and then the process is repeated.

Figure 4:
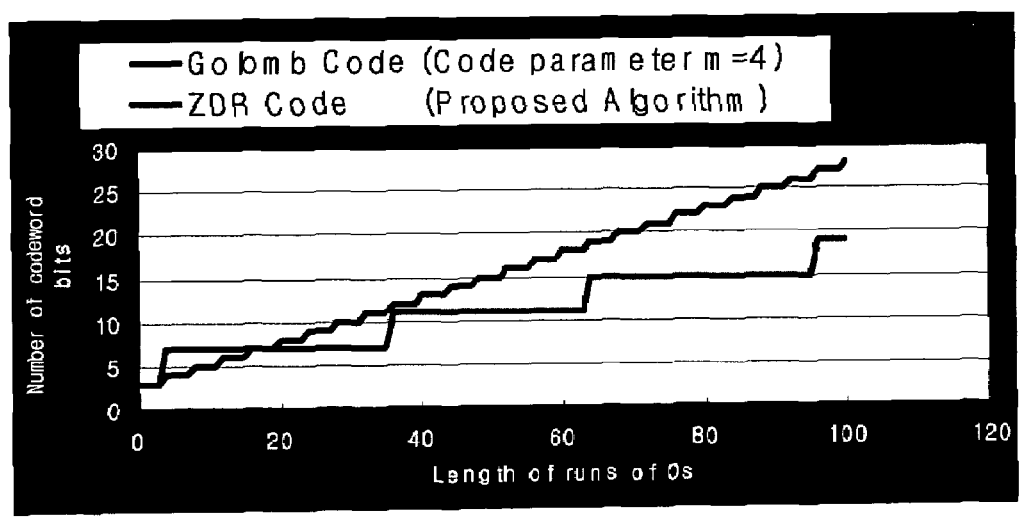
FIG. 4 is a graph showing the comparison between codewords generated by a conventional technique and a technique proposed by the present invention.

FIG. 4 is a graph showing the comparison of the ZDR code according to the present invention to the conventional Golomb code. It can be seen from FIG. 4 that the compression ratio of the ZDR code according to the present invention increases abruptly over the conventional Golomb code as the run-length of consecutive '0' bits is increased.

In the case of (define) FDR, a counter requires a size capable of accepting 2 bits when a group becomes larger. Accordingly, hardware capable of handling the longest run-length is needed. This considerably increases the counter size.

However, according to the compression and decompression method described in the present invention, the compression ratio has a logarithmic function curve and hardware can handle any run-length so that there is no need to reconstruct hardware depending on the core to be tested.

Table 5 represents data obtained through a comparative experiment executed for the ZDR code and Golomb code.

In Table 5, C.N. means a compression bit number and C.R. denotes a compression ratio.

TABLE 5

| Circuit | Bit number | Golomb code C.N. | Golomb code C.R. | ZDR C.R (3, 2) | ZDR C.R (4, 3) | ZDR Result C.N. | ZDR Result C.R. |
|---|---|---|---|---|---|---|---|
| C2670 | 140965 | 51485 | 63.48 | 69.38 | 71.13 | 40699 | 71.13 |
| C3540 | 25400 | 15706 | 38.17 | 41.00 | 29.69 | 14987 | 41.00 |
| C5315 | 180492 | 68619 | 61.98 | 67.19 | 66.94 | 59226 | 67.19 |
| C7552 | 136620 | 75550 | 44.70 | 51.96 | 45.20 | 65635 | 51.96 |
| C641 | 10692 | 5374 | 49.74 | 52.96 | 44.78 | 5030 | 52.96 |
| S713 | 10584 | 5370 | 49.26 | 52.31 | 43.78 | 5048 | 52.31 |
| S1196 | 7808 | 6044 | 22.59 | 25.60 | 12.50 | 5809 | 25.60 |
| S1238 | 8160 | 6155 | 24.57 | 27.25 | 14.75 | 5936 | 27.25 |
| S1423 | 33852 | 13605 | 59.81 | 63.68 | 62.66 | 12296 | 63.68 |
| S5378 | 259680 | 84415 | 67.49 | 72.14 | 73.60 | 68567 | 73.60 |
| S9234 | 456703 | 153331 | 66.43 | 73.10 | 74.84 | 114909 | 74.84 |
| S13207 | 2110500 | 559390 | 73.49 | 79.80 | 85.22 | 311834 | 85.22 |
| S15850 | 1955200 | 526833 | 73.05 | 79.27 | 84.37 | 305501 | 84.37 |
| S35932 | 5639837 | 1430412 | 74.64 | 80.85 | 86.87 | 740362 | 86.87 |

The present invention can solve at-speed testing and bottleneck problems generated when the number of test sets is increased in an SOC. Furthermore, the present invention enables tests even in an environment where an internal core structure cannot be easily known due to the copyright of IP. The present invention can meet the time-to-market theory because tests can be executed with compressed test sets by adding hardware using only a counter to the SOC core.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method of a test data compression using a Zero-Detected Run-length (ZDR) code in a system-on-chip, (SOC), which is stored in a form of algorism or computer programming, the method comprising the steps of:

defining a test vector $T_d$ to be applied and a test set $T_{diff}$ as follows, $T_d = \{t_1, t_2, t_3, t_4, t_5, \ldots, t_n\}$, and $T_{diff} = \{d_1, d_2, d_3, d_4, d_5, \ldots, d_n\} = \{t_1, t_1 \oplus t_2 \oplus t_3, \ldots, t_{n-1} \oplus t_n\}$ wherein $\oplus$ is an exclusive-OR operator;

creating the test vector $T_d$ and the test set $T_{diff}$ with values generated by an Automatic Test Pattern Generator (ATPG);

connecting the elements of the test set $T_{diff}$ in a single chain;

sequentially scanning the test set $T_{diff}$;

creating a codeword ("100", "101", "110" and "111") when a bit '1' appears, and when the codeword is '0000' (0001, 0020, 0011, 0100, 0101, 0110 and 0111);

repeatedly checking a '0 Group' ('0000', '0000×2', '0000×3', '0000×4', '0000×5', '0000×6', '0000×7' and '0000×8') while incrementing the bit of the '0 Group' counter by one until '1' appears as the next bit;

recording '0111' when the '0 Group' becomes '0000×8' and counting the number of bits having the value '0'; and creating a codeword of a '1 Group' on the SOC when a '1' bit appears.

2. A method of decompressing a test data compressed by the compression method using a decompression decoder including an Finite State Machine (FSM) and 3-bit counters in a system-on-chip, (SOC), the method comprising the steps of:

inputting a bit to the FSM through a signal BIT_IN when a signal EN, which represents that the FSM can accept data, is output from the FSMT;

activating signals 0_SIGN and COUNTER_START of a first 3-bit counter when the bit input to the FSM is '0' and activating signals 1_SIGN and COUNTER_START when the bit input to the FSM is '1';

inputting 2 bits to the first 3-bit counter through a signal SHIFT when the signal 0-SIGN is activated;

inputting 3 bits to the first 3-bit counter through the signal SHIFT when the signal 1_SIGN is activated;

operating the first 3-bit counter to output a signal C_OUT when the signal 0_SIGN is activated;

recording '100' in a second 3-bit counter when the second 3-bit counter receives the signal C_OUT;

activating a signal V_2 when the counting operation is finished;

allowing the first 3-bit counter to down-count one bit when the signal V_2 is input to the first 3-bit counter;

finishing the operation of the first and second counters when the signal 0_SIGN is input to the first 3-bit counter;

operating the 3-bit counters when the signal 1_SIGN is input to the first 3-bit counter and when the counting operation is finished, activating a signal V_1; and outputting a bit '1' through a signal OUT on the SOC when the signal V_1 is input to the FSM.

* * * * *